United States Patent [19]

Suwa et al.

[11] Patent Number: 4,531,060
[45] Date of Patent: Jul. 23, 1985

[54] POSITIONING METHOD

[75] Inventors: Kyoichi Suwa, Kawasaki; Kazuo Kuramochi; Kiwao Nakazawa, both of Tokyo, all of Japan

[73] Assignee: Nippon Kogaku K. K., Tokyo, Japan

[21] Appl. No.: 422,007

[22] Filed: Sep. 23, 1982

[30] Foreign Application Priority Data

Sep. 28, 1981 [JP] Japan .................................. 56-153207

[51] Int. Cl.$^3$ ............................................. G01H 21/86
[52] U.S. Cl. .................................. 250/548; 250/557; 356/400
[58] Field of Search ................... 250/548, 557, 561; 356/394, 397, 400, 401; 364/490, 491, 559

[56] References Cited

U.S. PATENT DOCUMENTS

| | | | |
|---|---|---|---|
| 3,989,385 | 11/1976 | Dill et al. | 250/548 |
| 4,238,780 | 12/1980 | Doemens | 250/561 |
| 4,259,724 | 3/1981 | Sugiyama | 364/491 |
| 4,318,003 | 3/1982 | Ono et al. | 356/401 |
| 4,395,125 | 7/1983 | Kaneko et al. | 250/548 |
| 4,423,959 | 1/1984 | Nakazawa et al. | 356/401 |
| 4,459,021 | 7/1984 | Blazek | 356/394 |

*Primary Examiner*—David C. Nelms
*Assistant Examiner*—Jim Gatto
*Attorney, Agent, or Firm*—Shapiro and Shapiro

[57] ABSTRACT

A method for positioning an object with patterns being formed thereon, employs a first device for extracting first information relative to patterns in a first region on the object, a second device for extracting second information relative to patterns from a second region including the first region on the object, an operating circuit to calculate a degree of coincidence between the first information and the second information, and a detecting circuit for detecting a position of the first region in the second region, whereby the position of the object can be reproduced with high reproducibility in accordance with the position as detected.

16 Claims, 24 Drawing Figures

FIG. 14
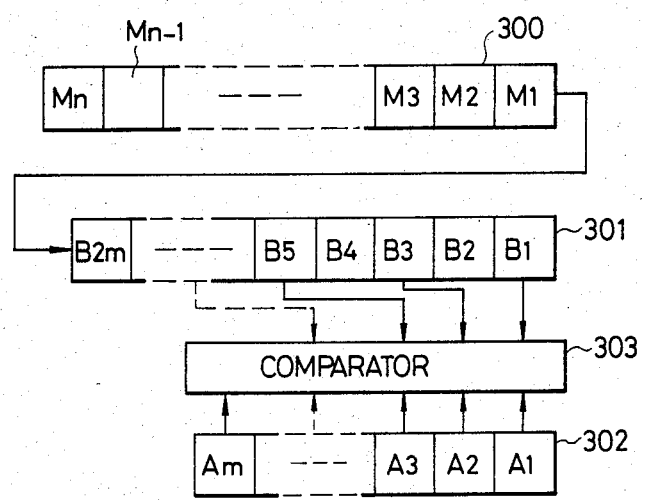
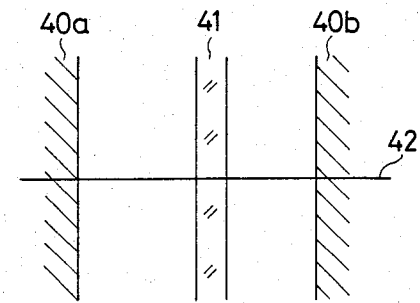
FIG. 15A
FIG. 15B
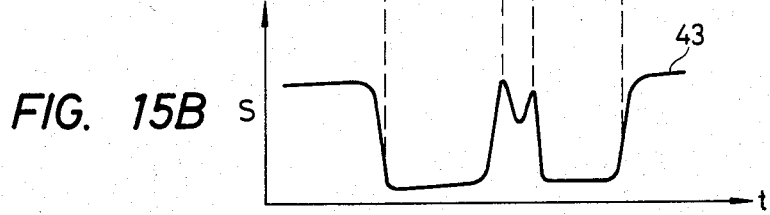
FIG. 15C
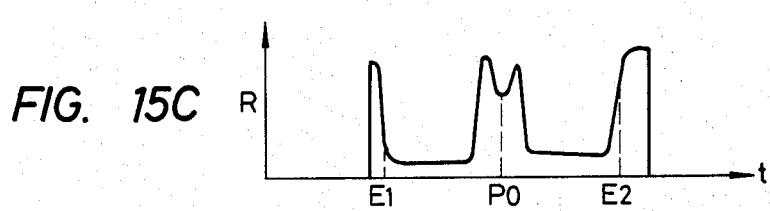

POSITIONING METHOD

BACKGROUND OF THE INVENTION

1. Field of the Invention

This invention relates to a method for positioning masks, reticles, wafers, and so on for production of semiconductor devices. More particularly, it is concerned with a positioning method adapted for use with a wafer prober and a wafer scriber.

2. Description of the Prior Art

As a system for automatically detecting a wafer position using a laser or a high brightness light source, there has been known one, in which a linearly converged laser spot irradiates wafer street lines and the scattered light above is photo-electrically detected. According to this known system, when the irradiated wafer street lines are totally reflecting surfaces, the photo-electric signal is approximate to zero. When the laser spot is on the circuit pattern, the scattering phenomenon becomes substantial and the photo-electric signal is detected with high intensity. Therefore, in utilization of the above-mentioned properties, the laser beam is oscillated with a predetermined amplitude, and a time interval where the photo-electric signal becomes substantially zero is measured, thereby detecting the wafer street lines.

In case, however, the street lines are of multi-layered structure, and the scattered light from the street lines has complicated intensities, or the street lines are perfectly non-existent in the wafer, the zero interval of the photo-electric signal cannot be measured; hence no position detection can be done.

SUMMARY OF THE INVENTION

A object of the present invention is to provide a method capable of positioning objects with good reproducibility, the objects having geometrical patterns with bright and dark tones, or with concavity and convexity on the surface.

Another object of the present invention is to provide a method for positioning a reticle, a photo-mask, or a wafer for production of semiconductor devices without using any special marks.

The positioning method according to the present invention employs a first means to extract first information at a first region on an object such as wafer or a mask, e.g., first information such as photo-electric signals concerning patterns in the vicinity of the street lines, and others, and to memorize the information as a template; a second means to extract second information at a region including the first region on the object, e.g., second information such as photo-electric signals concerning patterns from a region corresponding in length to one chip of the wafer or mask, at the time of the positioning operation, and to memorize the information as a group of data to be detected; operation means to calculate a degree of coincidence between the first and second information, i.e., between the template and the group of data to be detected; and a processing circuit, as a detecting means, to detect the position of the first region in the second region by finding the maximum coincidence between the group of data to be detected and the template, based on the results of calculation by the operation means.

In the preferred embodiments of the present invention, there are provided, for extracting the above-mentioned first and second informations, a means for scanning a spot light which has been elongated in one direction on an object, and a means for receiving light scattered from the object. The spot light has its longitudinal direction coincided with the direction of a boundary line demarcating the patterns on the object, e.g., the street lines, and scans on the object in a direction orthogonal to its longitudinal direction.

Since the positioning method according to the present invention performs a positioning operation by first preparing a template of the pattern information obtained from a predetermined region on the object, and finding out, at the time of the positioning, a degree of coincidence between the template and the pattern information to be obtained from the object, it is possible to carry out accurate positioning for an object having any shape and any concavo-convex surface pattern. Further, when a plurality of objects are to be positioned one after another using a positioning mark, even if the mark provided on each of the objects is commonly damaged, the positioning operation can be done without any problem whatsoever. This is due to the fact that, in the present invention, even the damage itself on the mark is incorporated into the template as a feature of the mark (or pattern).

The present invention is principally applied to reticles, photo-masks, or wafers for production of semiconductor devices as the objects to be positioned. Besides these objects, the present invention can also be applied to positioning of a printed substrate, on which various electronic parts are equipped.

BRIEF DESCRIPTION OF THE DRAWINGS

In the drawing:

FIGS. 6A through 6D are respectively diagrams showing signal waveform at every part of the wafer, which is obtained at the time of spot light scanning on the wafer, wherein FIG. 6A shows a single row of the chips arranged on the wafer; FIG. 6B indicates photo-electric signals of a photo-electric element; FIG. 6C represents clock signals of an oscillator; and FIG. 6D denotes a data group to be stored in a memory;

FIGS. 7A and 7B are diagrams respectively showing a manner of finding a degree of coincidence in the first embodiment of the present invention, wherein FIG. 7A shows a relationship between the data group to be detected and a template; and FIG. 7B indicates operating results;

FIG. 10B is a graphical representation showing such degree of coincidence;

FIGS. 12A and 12B are respectively diagrams for explaining a relationship between oscillation of spot light and photo-electric signals, wherein FIG. 12A is a graphical representation showing oscillation of the spot light, and FIG. 12B is a graphical representation showing the photo-electric signals;

FIGS. 13A and 13B respectively show a relationship between the oscillation of the spot light and the photo-electric signals, when the oscillating cycle of the spot light is changed in the third embodiment, wherein FIG. 13A is a graphical representation showing an oscillating cycle of the spot light, and FIG. 13B is a graphical representation showing the photo-electric signals;

FIG. 14 is a schematic circuit connection diagram of apparatus for implementing a fourth embodiment according to the present invention; and FIGS. 15A to 15C are respectively diagrams for explaining a manner of positioning the mask and the wafer, on both of which a special positioning mark is provided, wherein FIG. 15A shows a positional relationship between the marks on the mask and the wafer, FIG. 15B shows an image signal from an ITV, and FIG. 15C shows signals to be recorded as a template.

DETAILED DESCRIPTION OF THE PREFERRED EMBODIMENTS

Figure 1:
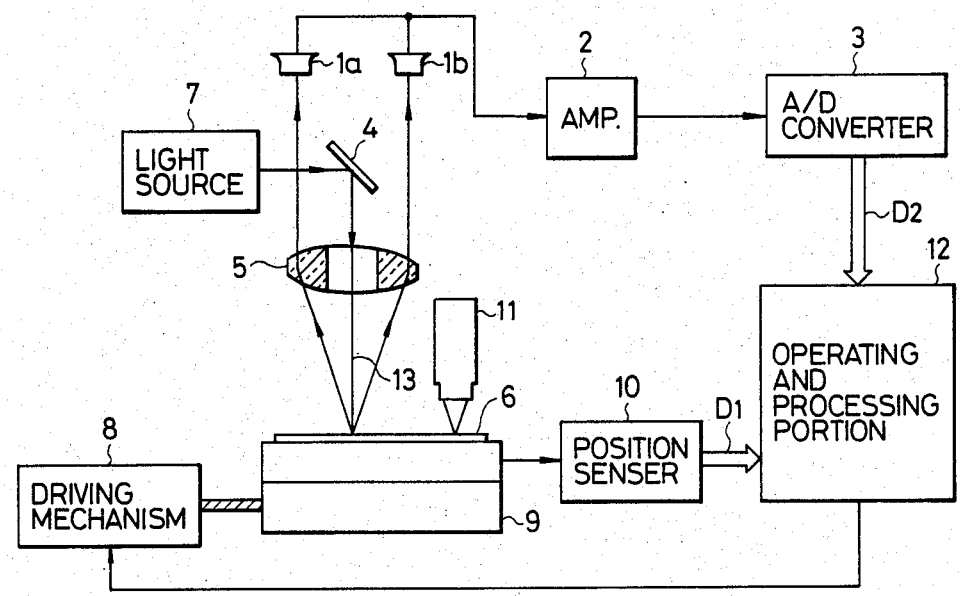
FIG. 1 is a schematic structural diagram showing apparatus implementing a first embodiment of the positioning method according to the present invention.
Figure 2:
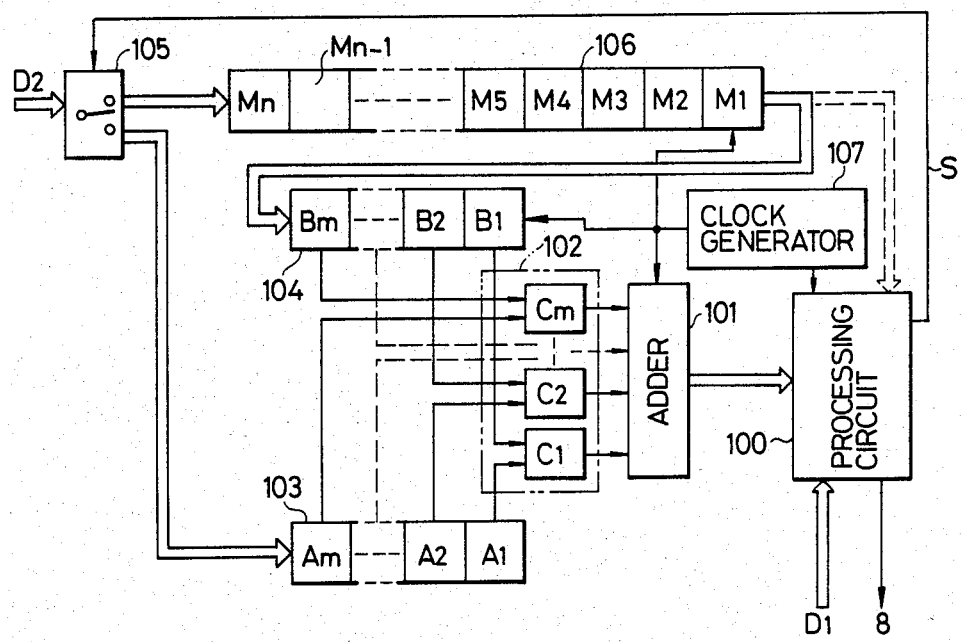
FIG. 2 is a schematic diagram showing a circuit construction of an operating and processing unit employed in the apparatus shown in FIG. 1.

In the following, the present invention will be described in detail with reference to the first embodiment thereof as shown in FIGS. 1 and 2.

A wafer 6 is mounted on a stage 9 provided with a position sensor 10 such as a laser interference type length measurement device, etc. The stage 9 is moved two-dimensionally by a driving mechanism 8 including a motor, etc. On the other hand, a laser spot light 13 which has been linearly converged in cross section is projected from a light source 7 including a laser oscillator. The laser light path from the light source is bent by a reflection mirror 4, passes through the center part of a ring-shaped lens 5, and irradiates the surface of the wafer 6. Upon the irradiation, the laser beam is scattered by concavo-convex patterns on the surface of the wafer 6, and the scattered laser beam alone is collected by the lens 5 to reach photo-electric elements 1a and 1b. Photo-electric signals from these photo-electric elements 1a and 1b are amplified by an amplifier 2 to a predetermined amplitude, and applied to the subsequent A/D converter 3 (hereinafter abbreviated as "ADC"). Accordingly, a digital signal output $D_2$ from the ADC 3 becomes proportionate to the intensity or the light quantity of the scattered light from the surface of the wafer 6. A microscope 11 for observing the pattern on the wafer 6 is provided for verifying whether the positioning of the wafer has been done accurately, or not. The position sensor 10 generates a position signal $D_1$ related to a two-dimensional position of the stage 9 with the irradiating position of the spot light 13, for example, as a reference, and introduces the position signal $D_1$ into the operating and processing unit 12 together with the signal $D_2$ from the ADC 3. The operating and processing unit 12 carries out required operations for the positioning based on the signals $D_1$ and $D_2$, simultaneously controls the driving mechanism 8 in accordance with the results of the operations, and causes the wafer 6 to move to a predetermined position.

Here, before entering into detailed explanations of the operating and processing unit 12 of the construction as shown in FIG. 2, there will be given explanations as to the meaning of rendering the laser beam in the linearly converged form, in reference to FIGS. 3 and 4.

Figure 3:
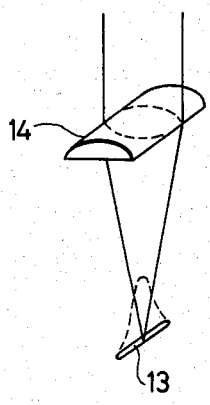
FIG. 3 is a perspective view showing an optical system for rendering a laser beam in a linearly converged form.

FIG. 3 illustrates schematically the optical system for producing a linearly converged spot light 13, wherein a circular spot of the laser beam is converted into the spot light 13 elongated linearly by a cylindrical lens 14, etc. provided in the light source 7. The size of the spot light 13 in its longitudinal direction is made substantially equal to a size of one side of a single chip, when the object to be positioned is a wafer or mask, wherein identical chip patterns are periodically arranged. When determined as such, the photo-electric elements 1a and 1b receive thereinto substantially all scattered light occurring in all directions from the edges (the stepped portions between the concave and convex surfaces) of the fine patterns existing in the portion to be irradiated by the spot light 13, when the stage 9 is moved in a direction orthogonal to the longitudinal direction of the linearly converged spot light 13, whereby the photo-electric signal does not change substantially with respect to fine changes in the patterns. This will be further detailed in reference to FIG. 4 which shows a relationship between the spot light 13 and two adjacent chips 50i, 50j on the wafer 6. The spot light 13 is moved along the direction of arrangement of the chips 50i, 50j, i.e., in a direction orthogonal to the longitudinal direction of the spot light with respect to the wafer 6. Accordingly, the spot light 13 moves with its lengthwise direction in parallel with a thin strip portion 53 of 50 to 100 $\mu$m in width which is provided between the adjacent chips (50i and 50j, for example) and which is called, in general, "street line". Within each chip, there is formed a region 51 where actual circuit patterns are formed, around which a plurality of bonding pats 52 are attached. Assume now that the size of the chip is 5 × 5 mm and that of the spot light is 5 mm × 50 $\mu$m. When the spot light 13 irradiates the region 51, the scattered light occurs in all directions, because the circuit patterns are in a complicated two-dimensional form. Accordingly, the photo-electric signals from the photo-electric elements 1a, 1b take a large value in average, while the spot light 13 is moving in the region 51. Further, when the spot light 13 irradiates the neighborhood of the pats 52, the photo-electric signal varies its magnitude with movement of the spot light 13, since the train of the pats 52 usually has a width of 100 $\mu$m or so. When the spot light 13 further irradiates the street line 53, the photo-electric signals from the photo-electric elements 1a, 1b take an extremely small value, because the street line 53 usually has a characteristic of totally reflecting light, i.e., the characteristic of not scattering light to a substantial extent. The above-mentioned variations in the photo-electric signal are reproduced to substantially the same extent at any position on the wafer 6, so long as the spot light 13 is longer in its longitudinal direction than the length of one side of the chip 50. By making the spot light 13 a linearly elongated ellipsoid, variations in the pattern density on the wafer 6 (e.g., number of fine line patterns existing in a region to be irradiated by the spot light 13, and so on) can be smoothed for accurate detection.

Now reverting to the operating and processing unit 12 as explained in reference to FIG. 1, its detailed construction will be described hereinbelow in reference to FIG. 2. The signal $D_2$ digitalized by the ADC 3 is introduced, as an input, into either a memory 103 or a memory 106 by means of a change-over switch (a multiplexer—hereinafter abbreviated as "MPX") 105. The memory 103 is to store the signal $D_2$ as a reference data group, and has m numbers of cells ($A_1$, $A_2$, ... $A_m$) for storing m numbers of data. Each of the cells $A_1$ through $A_m$ is constructed with the same bit number as that of the signal $D_2$, and the data as stored therein can be shifted sequentially from the cell $A_m$ to the cell $A_1$. On the other hand, the memory 106 is to store the signal $D_2$ as a data group to be detected, and has n numbers of cells ($M_1$, $M_2$, ... $M_n$) for storing n numbers of data. It is memory 103 is smaller than the number of cell n in the memory 106. The data in each of the cells of the memory 106 can also be shifted sequentially from $M_n$ to $M_1$. The data which has been shifted from the cell $M_1$ can be input into a processing circuit 100 for preparing the above-mentioned reference data group, and is also input into a subsequent take-out memory 104. The memory 104 is constructed with m numbers of cells ($B_1$ through $B_m$), the same as the memory 103, so that it may take out in sequence the m-number of the data from the memory 106. The data groups as stored in both memories 103 and 104 are then input into a comparator 102, and the data in each cell is operated upon by comparison circuits $C_1$, $C_2$, ... $C_m$ in the comparator 102 for an absolute value of their difference. The result of each operation in each of the comparison circuits $C_1$, $C_2$, ... $C_m$ is added up by an adder 101 for the total sum, and the result of the summation is introduced as an input into the processing circuit 100 such as a micro-computer. The processing circuit 100 examines, on the basis of the result of calculation by the adder 101, a digital pattern matching, or coincidence, between the reference data group in the memory 103 and the data group in the memory 104 sequentially taken out of the data group for detection as stored in the memory 106. The processing circuit 100 also introduces as an input thereinto the signal $D_1$ from the position sensor 10 and produces an output control signal to the driving mechanism 8 to drive the stage 9 based on the coincidence as examined. The memory 106, memory 104, adder 101, and processing circuit 100, and others perform their own operations in synchronism with the clock signal output from a clock generator 107. The processing circuit 100 also produces an output signal S to operate the above-mentioned MPX, the details of which will be explained later.

Figure 4:
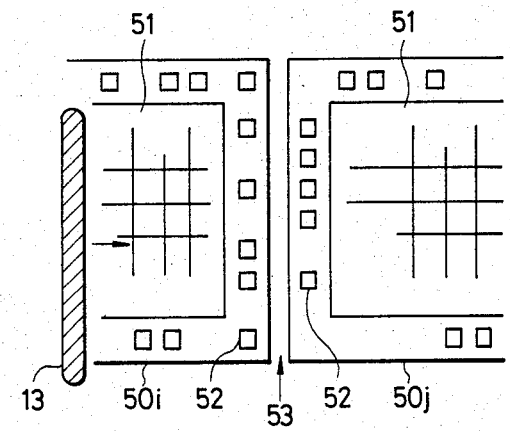
FIG. 4 is a diagram showing a relationship between chips on the wafer and a spot light.
Figure 5:
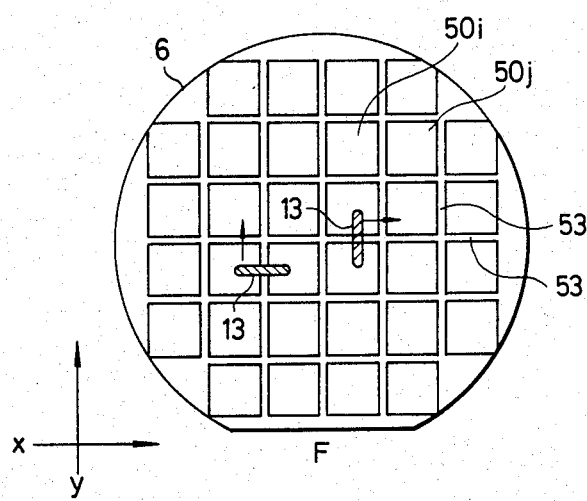
FIG. 5 is a diagram showing a position of the spot light on the wafer.

As shown in FIG. 4, the spot light 13 moves along the direction of arrangement of the chips $50i$, $50j$, while maintaining its parallellity with the street line 53, when the relationship between the spot light 13 and the wafer 6 is as shown in FIG. 5. That is to say, a plurality of chips 50, each having the same pattern, are formed on the wafer 6 in a matrix shape, one of the rows of which, i.e., the chips $50i$, $50j$ horizontally arranged in the left and right direction as viewed from the top surface of the drawing sheet, is in parallel with a flat F formed by linearly cutting a part of the circumference of the wafer 6. This flat F constitutes a reference edge for rough positioning (also called 'pre-alignment') of the wafer 6. A rotatory correcting mechanism which rotates the wafer 6 mounted on the stage 9 is incorporated in the stage. At the time of the pre-alignment, the flat F is set in parallel with one of the moving directions of the stage 9, e.g., x-direction shown in FIG. 5. In this manner, the two mutually intersecting moving directions x and y of the stage 9 and the two mutually intersecting street lines on the wafer 6 are brought in parallel with each other. In this pre-aligned condition, when the stage 9 is moved in either the x-direction or the y-direction, while the spot light 13 irradiates the wafer 6, the surface of the wafer 6 is scanned by the spot light 13. In this case, as shown in FIG. 5, if the stage 9 is moved in the x-direction, the spot light 13 is linearly converged in the y-direction, while, when it is moved in the y-direction, the spot light is converged in the x-direction.

In the following, the operation of the positioning method according to the first embodiment of the present invention will be explained in reference to FIGS. 6A to 6D and 7A and 7B.

First of all, the first sheet of the wafer 6 as the object to be positioned is mounted on the stage 9, after which the pre-alignment is effected by a rotational fine adjustment mechanism, etc. Upon completion of the pre-alignment, the stage 9 is moved a predetermined amount, and the spot light 13 irradiates a predetermined position on the wafer 6. This position is such that the spot light 13 may irradiate a particular chip on the wafer 6 over the substantially entire width thereof, as shown, for example, in FIG. 6A, because the size of the wafer 6 and the chip 50 are determined in advance. In this case, the output position signal $D_1$ from the position sensor 10 is read in the processing circuit 100 and stored therein. Thereafter, the stage 9 is moved at a constant speed in one direction, i.e., a direction orthogonal to the longitudinal direction of the spot light 13, whereby the spot light 13 scans the chip 50 on the wafer 6 in the left direction. With this scanning operation, the photo-electric element 1 generates a periodical photo-electric signal that takes a large value in average at the region 51 in the chip 50 where the circuit pattern is formed, as shown in FIG. 6B, and an infinitesimal value at the street line 53. When the spot light 13 continues to scan the wafer 6, the photo-electric signal varies periodically. In this case, since the moving amount of the stage 9, i.e., the scanning amount of the spot light 13, is determined to be corresponding to a length $L_1$ which is approximately a length of one side of the chip 50, the processing circuit 100 introduces the signal $D_2$ from the ADC 3 into the memory 106 by changing over of the MPX 105 when the spot light 13 scans the length $L_1$. In this instance, the signal $D_2$ is taken into each of the cells $M_1$ through $M_n$ in the memory 106 in synchronism with the clock signal from the clock generator 107, while it is being shifted.

Figure 6A:
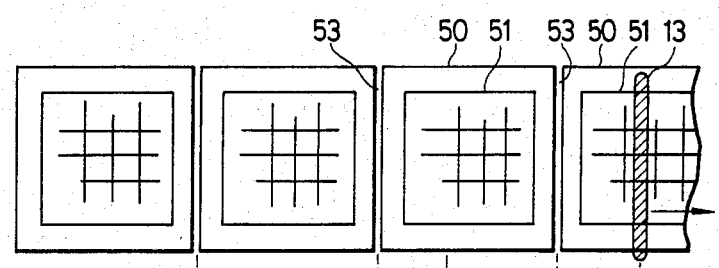
Figure 6B:
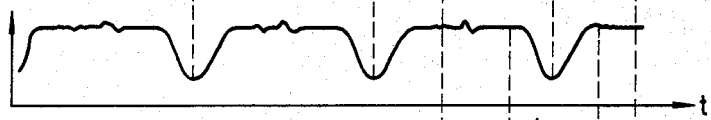
Figure 6C:
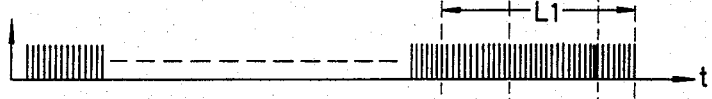
Figure 6D:
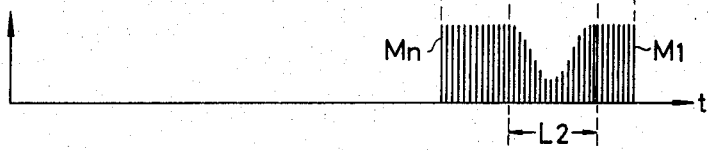

FIG. 6C shows the clock signal, wherein the number of clocks to be generated during scanning of the spot light 13 for the distance $L_1$ can be determined primarily, because the stage 9 is moved at a constant speed. Therefore, when the clock number in the distance $L_1$ is made equal to the cell number n in the memory 106, there is stored in the memory 106 a data group, as shown in FIG. 6D, which is obtained by sampling the photo-electric signal corresponding to the distance $L_1$ for n times at every one clock. If the distance $L_1$ and the sampling number n have been made known beforehand, it can be readily found to what extent the sampling interval corresponds to a length on the wafer 6.

Thereafter, the data group in the memory 106 is introduced as an input into the processing circuit 100, wherein a portion of substantial change among the data in the cells $M_1$ through $M_n$ (a characteristic portion in the data group), e.g., a section $L_2$ containing the street line 53 as shown in FIG. 6D, is found out. This characteristic portion can be found by, for example, sequentially comparing the data in the cells $M_1$ through $M_n$ to locate a position of the cell where the smallest data is stored; then, with this position being made the center, a position of the cell at both sides of this center, which is distant by $L_2/2$ (which position in the first to n'th of the cells), is found. Length of this section $L_2$ is determined to be corresponding to the cell number m in both memory 103 and memory 104, i.e., to the m clock of the clock signal. As soon as the length of the section $L_2$ is determined, the stage 9 moves again to the scanning start position of the spot light 13, i.e., the position of the stage 9 which has previously been stored. Next, the stage 9 is moved once again at constant speed the same as before to scan the wafer 6 with the spot light 13. At this instant, the processing circuit 100 changes over the MPX 105 beforehand so that the signal $D_2$ may be introduced as an input into the memory 103. Then, when it is detected that the clock number to be generated with scanning of the spot light 13 attains a predetermined value, and the scanning light is about to come into the section $L_2$, the processing circuit 100 generates a data reading signal to the memory 103. This data reading signal may be one that corresponds to the m clock taken out of the clock signal from the clock generator 107, while the spot light 13 is moving across the section $L_2$, whereby the reference data group which has sampled the photo-electric signal in the section $L_2$ is stored in the cells $A_1$ to $A_m$ of the memory 103. After this, the reference data group in this memory 103 is retained as the template for positioning the wafer in the second sheet and onward (a reference pattern for matching).

The above-mentioned reference data group is prepared in the same manner for both x and y directions on the wafer 6 as shown in FIG. 5. Incidentally, the processing circuit 100 stores therein the position signal $D_1$ from the position sensor 10 when the spot light 13 is about to come into the section $L_2$. The position of the stage 9 as stored in the processing circuit 100 corresponds to a position for starting preparation of the data group, hence this will hereinafter be called "template reference position". Subsequently, the stage 9 is moved, a predetermined amount, to a desired alignment position, e.g., a center position for probing in the case of a wafer prober, and to a position where the mask is present in the case of an exposure device, thereby carrying out necessary operations.

When the first sheet of wafer has been processed in the above-described manner, the second sheet of wafer is mounted on the stage 9 to position the same at the alignment position. In general, a large number of wafers which are in the same pattern arrangement and which have undergone the same manufacturing processes have extremely small differences among them in their surface conditions, so that the photo-electric signal to be obtained at the time of scanning on the wafer by the spot light 13 is of high similarity for each and every wafer. Therefore, by effecting pattern matching, at the time of positioning the wafer of the second sheet and onward, between the reference data group in the x and y directions prepared for the first sheet of wafer (hereinafter simply referred to as "template $T_p$") and the data group for detection which is obtained from the wafer to be positioned, there can be achieved such positioning with highly satisfactory reproducibility. This operation will further be explained in detail in reference to FIGS. 7A and 7B.

Figure 7A:
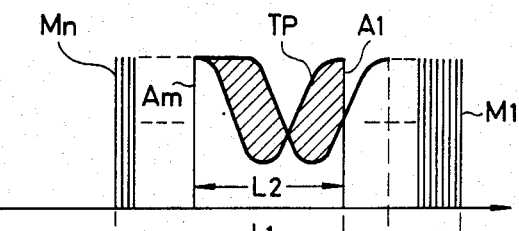
Figure 7B:
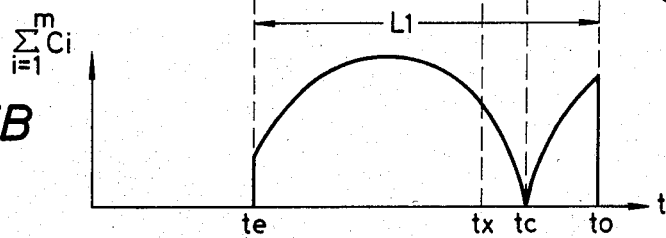

The wafer of the second sheet onward is sent by the stage 9 into the irradiating position of the spot light 13, where the spot light 13 irradiates substantially the same position (i.e., onto the same chip) as that of the first sheet of wafer, as shown in FIG. 6A. The processing circuit 100 produces an output signal S to change over the MPX 105, thereby making connection such that the signal $D_2$ from the ADC 3 is input into the memory 106. Then, by moving the stage 9 at a constant speed, the scanning is done by the spot light 13 for the distance $L_1$ on the wafer as in FIG. 6B, then the sampling of the photo-electric signal from the photo-electric element 1 is done, and the result of the sampling is stored in the memory 106 as the data group for detection, all being in the same manner as the above-mentioned operations. Upon movement of the stage 9 being completed, each of the data in the cells $M_1$ to $M_n$ of the memory 106 is sequentially shifted from the cell $M_1$ into the take-out memory 104 in response to the clock signal. With this shifting operation, the data in each of the cells $A_1$ to $A_m$ of the memory 103 and the cells $B_1$ to $B_m$ of the memory 104 is operated upon for its coincidence by each of the comparison circuits $C_1$ to $C_m$ in the comparator 102, and by the adder 101 to determine the results of the comparison. Incidentally, the data in both memories 103 and 104 are representative of the analog signals in the simple form of digital values, and the coincidence is verified here with a logic of $C=|A-B|$. This logic is to perform subtraction of each data in the cells $B_1$ to $B_m$ from each corresponding data in the cells $A_1$ to $A_m$ for each cell, from which the absolute value of the difference as found is calculated. Each output signal ($|A_m - B_m|$) from each of the comparison circuits $C_1$ to $C_m$ is added up by the adder 101, the result of which is introduced as an input into the processing circuit 100. The adder 101 calculates $$\sum_{i=1}^{m} C_i$$

for every clock of the clock signal. FIGS. 7A and 7B illustrate the above-mentioned relationship. Here, since the data group in the cells $B_1$ to $B_m$ of the memory 104 is obtained by the sequential shifting of the data group for detection in the memory 106, this constitutes pattern matching by shifting the template $T_p$ in the memory 103 over the data group for detection. In this connection, if a time instant when the data in the cell $M_1$ of the memory 106 shifts to the cell $B_1$ of the memory 104, and the data in the cell $A_1$ and the cell $M_1$ are operated upon by the comparison circuit $C_1$ is assumed to be "$t_0$", the above-mentioned value $$\sum_{i=1}^{m} C_i$$

is calculated by the adder 101 at every clock for a period from the above-mentioned time instant $t_0$ to a time instant $t_e$ when the data in the cell $A_m$ and the cell $M_n$ are compared. The result of this calculation will be as shown in FIG. 7B, wherein the axis of ordinate indicates the result of $$\sum_{i=1}^{m} C_i.$$

From the time instant $t_0$, the memory 106 starts to shift, and, at a time instant $t_c$, the result of the calculation becomes infinitesimal. The processing circuit 100 sequentially reads thereinto the result of calculation from the adder 101 in synchronism with the clock signal, and detects the infinitesimal value at the time instant $t_c$, i.e., the highest degree of coincidence. In FIGS. 7A and 7B, the result of calculation at a time instant $t_x$ corresponds to an area shaded with diagonal lines in FIG. 7B. The position of the pattern matching with the template $T_p$ can be found out from the data group for the detection in the memory 106 only by calculating the clock number from the time instant $t_0$ to the time instant $t_c$. With this clock number, the processing circuit 100 finds out an amount of difference between the position where the spot light 13 starts its scanning on the second sheet of wafer and the template reference position as determined by the first sheet of wafer. That is to say, when the stage 9 is moved for the number of clocks from the time instant $t_0$ to the time instant $t_c$, the second sheet of wafer can be accurately positioned on the template reference position on the first sheet of wafer.

As mentioned above, since the photo-electric information obtained from the patterns on the first sheet of wafer is made into the template, to which the wafer of the second sheet and onward is positioned, it suffices that a plurality of wafers to be mutually positioned may have a single pattern thereon, and there is no necessity for providing any special mark for the positioning. In addition, since the spot light 13 has an elongated cross-section so as to cover a length corresponding to substantially one cycle of the periodic pattern, the photo-electric signal varies conspicuously only in the vicinity of the street line on the wafer when the scattered light from the pattern is to be photo-electrically detected as the photo-electric information. Such cross-sectional shape of the spot light can, therefore, be used for detection of the space between the adjacent chips, i.e., for detection of the so-called street line.

In the following, explanations will be given in reference to FIGS. 8 to 10B as to the second embodiment of the positioning device according to the present invention, wherein the method of processing the photo-electric information has been changed.

Figure 8:
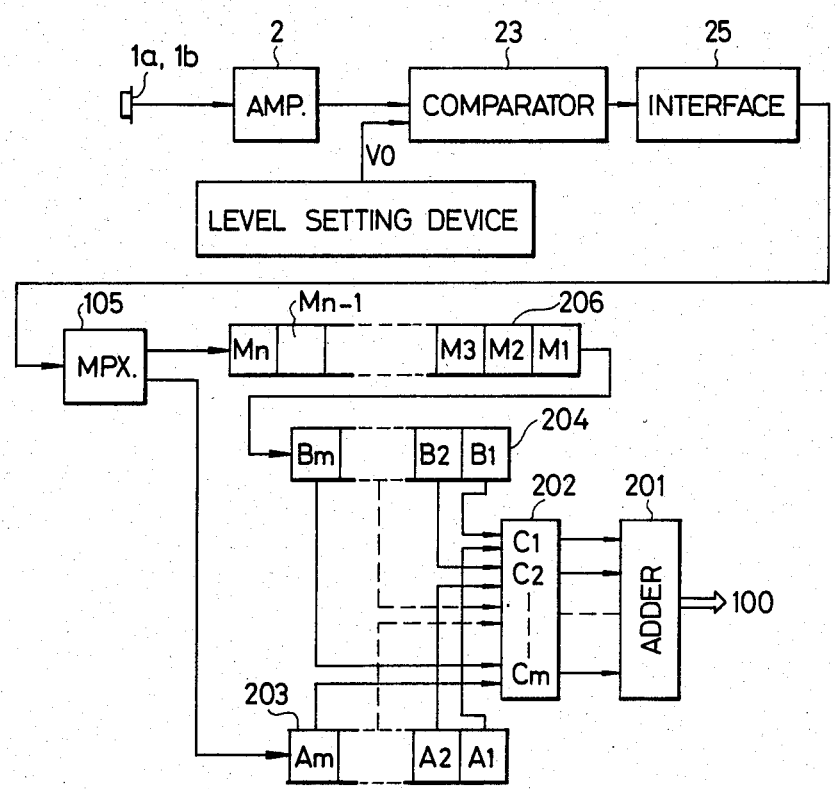
FIG. 8 is a schematic circuit diagram of apparatus for implementing a second embodiment according to the present invention.

FIG. 8 is a block diagram showing the circuit construction for implementing the positioning method according to the second embodiment of the present invention, wherein structures the same as those in the first embodiment are designated by the same reference numerals.

The photo-electric signal from the photo-electric elements 1a, 1b to receive the scattered light from the wafer is introduced as an input into a comparator 23 through the amplifier 2. The comparator 23 compares an output reference voltage $V_0$ from a level setting device 24 with the photo-electric signal, and quantizes the photo-electric signal with respect to a difference from the comparison. The quantized signal is introduced as an input into the MPX 105, while taking an electrical matching by an appropriate interface 25. A signal selected by the MPX 105 is introduced as an input into either a memory 206 or a memory 203. The memory 203 is to store therein the template, same as the first embodiment, while the memory 206 is to store the data group for detection. A memory 204 is to take out the data group in the memory 206. The number of cells in each memory 203, 204, and 206 is determined in the same manner as in the first embodiment. However, since the output signal from the interface 25 is a time-sequential, quantized signal, the cell in each memory may be of 1-bit construction, so that the memory 203 and the memory 204 are constructed with serially-connected shift registers of m-bit, and the memory 206 with serially-connected shift registers of n-bit. Accordingly, the cell in each memory ($A_m$, $B_m$ and $M_n$) will hereinafter be called [bit].

The comparator 202 to compare each data group in the memories 203 and 204 includes comparison circuits $C_1$ to $C_m$, each of which compares the bits $B_1$ and $A_1$, $B_2$ and $A_2$, ... $B_m$ and $A_m$, respectively. The comparison circuits $C_1$ to $C_m$, unlike the first embodiment, performs a logical operation $C = A \cap B$ or $C = A \cdot B$. Incidentally, the operation $C = A \cap B$ corresponds to a calculation of a digital interrelationship between A and B, which can be performed by an "exclusive OR" and "inclusive OR". The results of operation by the comparator 202 are introduced as inputs into an adder 201 which, in turn, calculates the total of the logic value "1" or the logic value "0" from among the operated outputs from the comparison circuits $C_1$ $C_m$, and introduces the sum total as an input into the processing circuit 100 as referred to in the first embodiment. The clock signal, and so forth are also introduced as inputs into the processing circuit as is the case with the first embodiment.

Figure 9:
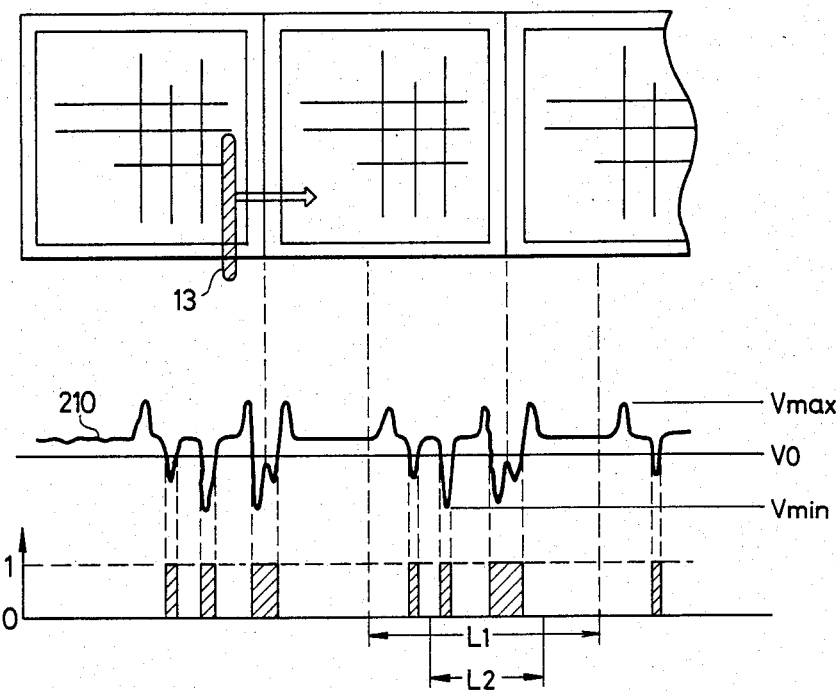
FIG. 9 is a diagram for explaining a relationship between spot light scanning and signals in the second embodiment of the present invention.
Figure 10A:
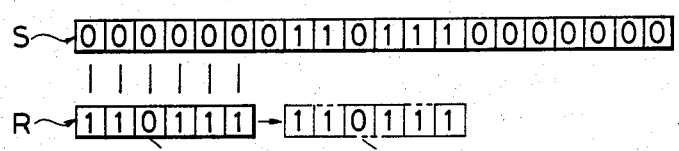
FIGS. 10A and 10B are respectively diagrams showing a manner of finding a degree of coincidence in the second embodiment of the present invention, wherein FIG. 10A indicates a relationship between the bit patterns in a memory and a degree of coincidence.
Figure 10B:
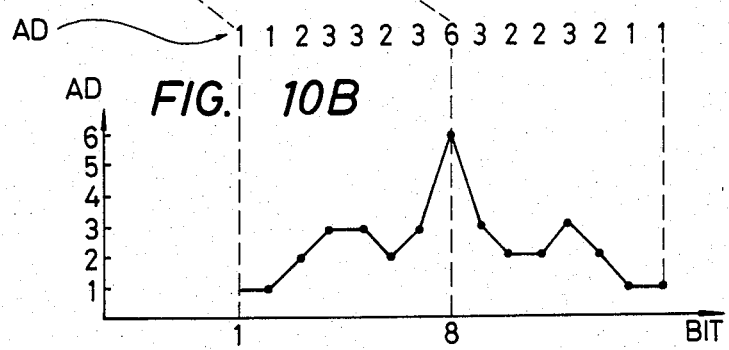

The operation of the positioning method according to the second embodiment will be further explained in reference to FIGS. 9, 10A and 10B.

As a premise, it is to be understood that the comparator 23 produces the logic value "1" when the reference voltage $V_0$ is higher in its level than a photo-electric signal 210, in case the photo-electric signal 210 is generated as shown in FIG. 9. Needless to say, movement of the stage, shifting of the memories 206 and 204, and other operations are all synchronized with the clock signal, as already mentioned in the foregoing. Then, a quantized signal of the photo-electric signal 210 corresponding to the distance $L_2$ on the first sheet of wafer is stored in the memory 203 to make the template. This template making operation is the same as that in the first embodiment. That is to say, the quantized signal is once stored in the memory 206 in sequence, and then a portion where the bit pattern varies substantially in the memory 206 is found out by the processing circuit 100, which is made the template.

For the wafer of the second and subsequent sheets, the spot light 13 is caused to scan on the wafer for substantially one chip, i.e., the distance $L_1$ on the wafer, and a signal which is quantized at that time is sequentially stored in each bit of the memory 206 in response to the clock signal. Thereafter, a degree of coincidence between the template in the memory 203 and the data group sent out of the memory 204 is found by the comparator 202 and the adder 201. Incidentally, the reference voltage $V_0$ is determined, for example, to a half value between the maximum value $V_{max}$ and the minimum value $V_{min}$ of the photo-electric signal 210. A mode of the degree of coincidence will be explained hereinbelow in reference to FIGS. 10A and 10B, as an example. In FIG. 10A, reference letter S denotes a bit pattern as the data group for detection in the memory 206, and R represents a bit pattern as the template. AD designates a total number as operated by the adder 201, i.e., the degree of coincidence. Since the memory 206 is sequentially shifted by the clock signal, it is considered that the template shifts on the data group for detection, bit by bit. If it is assumed that the bit pattern R of the template is of 6-bit construction, the bit to be coincided with that at the start of the bit pattern S is one out of the six bits. Next, when the bit pattern R is shifted one bit to the right, the number of the coinciding bit is still one out of the six bits. After repetition of this shifting operation for seven times, i.e., when the eighth bit from left of the bit pattern S coincides with the leftmost bit of the bit pattern R, the six bits become coincided entirely. FIG. 10B illustrates this condition, wherein the highest degree of coincidence is attained at the eighth bit from beginning of the bit pattern. Then, the processing circuit 100 examines the position of this highest degree of coincidence, i.e., the bit in the memory 206 where such coincidence has been realized. Upon finding of the position, the operations thereafter are carried out in the same manner as in the first embodiment.

In this manner, by quantization of the photo-electric signal as the photo-electric information with a predetermined slice level, not only high speed data processing becomes possible in real time, but also the circuit construction can be advantageously simplified without necessity for a memory having a large storage capacity.

Figure 11:
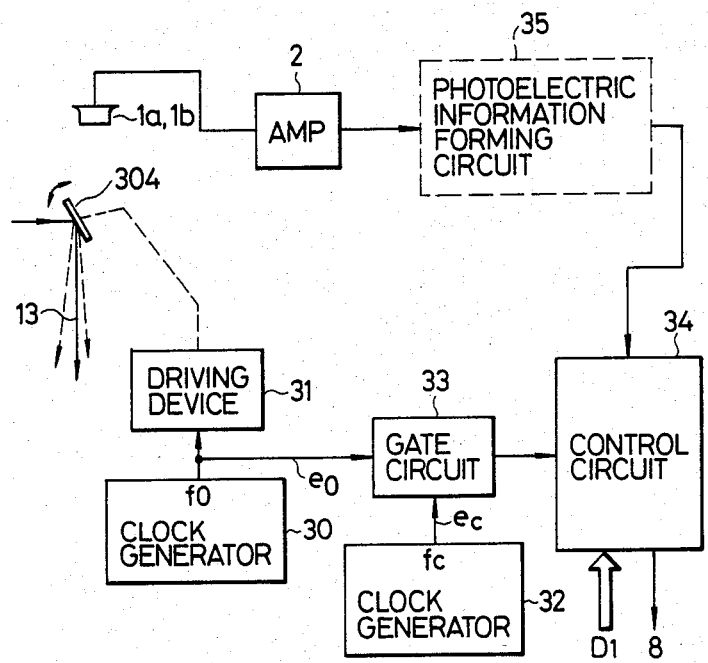
FIG. 11 is a schematic circuit diagram of apparatus for implementing a third embodiment of the present invention.

In the following, the third embodiment of the present invention will be explained in reference to FIG. 11. Unlike the first and second embodiments, this third embodiment is to obtain the photo-electric information by oscillating the spot light 13. It should be noted that, in FIG. 11, those parts having the same functions as those in FIG. 1 are designated by the same reference numerals, and their detailed explanations will be dispensed with.

In the illustrated embodiment, a movable mirror 304 for oscillating the laser beam is provided in place of the mirror 4 in FIG. 1. The mirror 304 oscillates at a frequency $f_0$ through a driving device 31 to introduce an input signal of the frequency $f_0$ from a clock generator 30. As is the case with the previous embodiments, there is provided a clock generator 32 to generate a reference time for sampling the photo-electric information at every predetermined time. An output signal of an oscillating frequency $f_c$ from this clock generator 32 becomes a clock signal which is determined to have its frequency greater than the frequency $f_0$. A gate circuit 33 produces an output clock signal to a control circuit 34 at a predetermined periodic interval in response to the signal oscillated from the clock generator 30. The control circuit 34 has substantially the same function as that of the above-mentioned operating and processing unit 12, the detailed explanations of which will be given later, since its manner of processing informations is somewhat different from the unit 12.

The photo-electric signal from the photo-electric elements 1a and 1b which receive the scattered light from the wafer is introduced as an input into a photo-electric information forming circuit 35 through the amplifier 2 as is the case with the previous embodiments. This forming circuit 35 may be constructed with the ADC 3 as in the first embodiment, or with the quantizing circuit as in the second embodiment. The gate circuit 33 is so constructed that it may take synchronism between the oscillating phase or the frequency $f_0$ of the signal $e_0$ from the clock generator 30 and the clock signal $e_c$. For example, the circuit is constructed such that one clock of the clock signal may be introduced as an input into the control circuit 34 at the center of oscillation of the signal $e_0$. The control circuit 34 is also provided with a memory to retain the template and a memory to store therein the data group for detection, as is the case with the first and second embodiments.

Figure 12A:
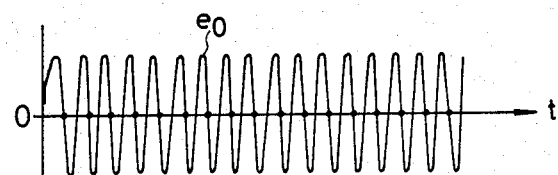
Figure 12B:
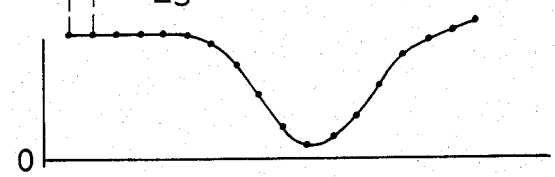

The operation of the second embodiment will be explained in reference to FIGS. 12A, 12B, 13A, and 13B. When the spot light 13 is oscillated with a certain definite amplitude by the signal $e_0$ as shown in FIG. 12A to cause the clock signal $e_c$ to be in synchronism with one cycle of the oscillation, thereby sampling the photo-electric information at every cycle at the center of the oscillation, the photo-electric information (which is taken as a magnitude of the photo-electric signal, for the sake of convenience here) is represented as in FIG. 12B. In this case, the control circuit 34 reads thereinto a signal from the photo-electric information forming circuit 35 with a predetermined timing of the oscillation of the spot light 13 to thereby store sequentially the data group for detection (or the template preparing data group) in each cell of the memory. In this instance, however, since the sampling of the scattered light from the wafer is carried out at one place of the oscillation of the spot light 13, it becomes inevitably necessary that the stage 9 be moved as is the case with the first and second embodiments. Therefore, when, for example, the stage 9 is moved at a constant speed, there can be sampled the photo-electric information as shown in FIG. 12B. It goes without saying that the stage 9 may be moved by taking synchronism between the control circuit 34 and the clock signal conforming to the oscillation cycle to be obtained from the gate circuit 33. In this case, the sampling interval, i.e., $\Delta S$ shown in FIGS. 12A, 12B is determined by the frequency of the signal $e_0$ from the standpoint of timing, while the space interval on the wafer is primarily determined by the frequency of the signal $e_0$ and the moving speed of the stage 9. In this manner, the control circuit 34 stores therein the sampled photo-electric informations as the data group for detection or the template. The processing thereafter will be done as already mentioned in the foregoing.

Figures 13A, 13B:
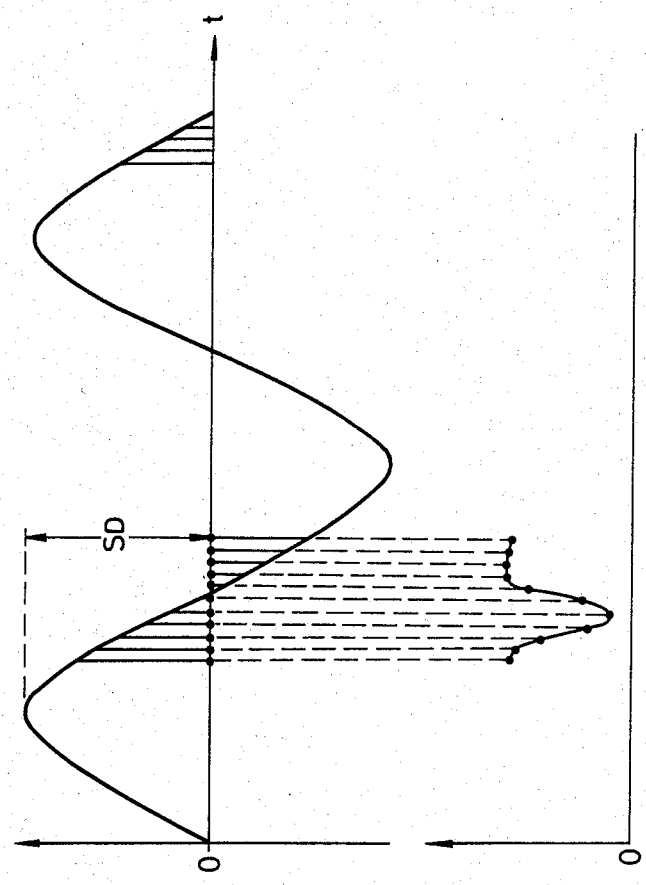

Different from the case of FIGS. 12A and 12B, when the stage 9 is not moved at all, there is obtained the data group as shown in FIGS. 13A and 13B. FIG. 13A indicates an oscillating condition of the spot light 13, wherein an oscillating amplitude $S_D$ of the spot light 13 on the wafer is determined, for example, to the size of one chip. In this instance, if the signal $e_0$ has a waveform similar to that of the oscillating locus of the spot light 13, the sampling of the photo-electric information is effected at a portion in the waveform of the signal $e_0$ having high linearity in approximation, i.e., in the vicinity of the center of oscillation. In so doing, the sampling interval on the wafer takes a substantially equal space interval, and the scanning becomes apparently linear, even though the spot light 13 sinusoidally oscillates with respect to time. The gate circuit 33 is so constructed that it becomes open, at this time, only in the vicinity of the center of oscillation of the signal $e_0$ to permit passage of the clock signal $e_c$. For this purpose, the gate circuit 33 may take a circuit construction such as a window comparator having a slice level in a predetermined positive and negative amplitude from the center of oscillation of the signal $e_0$. While no synchronism needs to be particularly taken between the clock signal $e_c$ and the signal $e_0$, the number of clock signal to pass during opening of the gate circuit 33 is made equal to, or larger than, the number of cells in the memory for storing the data group for detection. Thus, the photo-electric information sampled at the portion of the signal $e_0$ with high linearity is as shown, for example, in FIG. 13B. Needless to say, during each sampling, the photo-electric information is sequentially stored in each cell of the memory. Therefore, by use of only a highly linear portion in the vicinity of the center of oscillation of the spot light 13 which is being oscillated with a large amplitude, there can be realized data collection with extremely high reproducibility in place of the rectilinear scanning by the stage movement. Moreover, since the stage is not moved, the data collection depends upon the oscillating speed (on the wafer) of the spot light 13, which signifies that the data input can be done at a very high speed. According to the method as represented in FIGS. 12A and 12B, the stage can also be moved for a rough positioning of the wafer, when such is required, while collecting the data. It is, of course, possible that the position of the street line can be found on the basis of the data collected at this time.

In the afore-described embodiments, there can be made further modification of the processing circuit, as will be mentioned hereinbelow.

(1) Addition of a differentiation circuit:

A differentiation circuit is connected between the amplifier to amplify the photo-electric signal and the photo-electric information forming circuit 35 such as ADC, etc. In this case, a differentiation output is zero at the stabilized flat portion of the photo-electric signal, while it fluctuates at the changing portion of the signal. Based on such differentiation output, a portion having characteristically large fluctuation is used for preparing the template, etc., whereby, when the data are to be collected from the wafer having a pattern with considerable variations in part, any undesirable effects such as even a slight fluctuation in the photo-electric signal, etc. can be prevented, and the noise characteristic is improved.

(2) Operation of the degree of coincidence by thinning:

This measure is for increasing the speed of operation for the degree of coincidence, which will be explained hereinbelow in reference to FIG. 14 showing the fourth embodiment of the present invention. FIG. 14 only illustrates a memory 300 to store therein the data group for detection, a memory 301 to take out the data group from the memory 300, a memory 302 to store therein a template, and a comparator 303 to compare the data in the memory 301 and the template. The rest of the circuit construction is the same as that in the FIG. 2 embodiment.

The point of difference in this embodimental construction from those in the previous embodiments is that the number of cells in the memory 301 has been doubled. That is to say, the memory 301 is constructed with at least $2m-1$ number of the cells. The memory 302 to store therein the template has m number of the cells. The comparator 303 effectively thins out the cells $B_1$ to $B_{2m}$ of the memory 301 by comparing every other one of these cells with the cells $A_1$ to $A_m$ of the memory 302. In this case, the cells $A_1$ to $A_m$ have stored, in their full length, the data groups equal to the cells $B_1$ to $B_{2m}$ which are divided into m numbers. This means that the sampling interval of each data stored in each of the cells $A_1$ to $A_m$ of the memory 302 has become doubled in equivalence with respect to the sampling interval of each data to be stored in each of the cells $M_1$ to $M_n$ of the memory 300. In other words, by squeezing the photo-electric information having a length corresponding to substantially twice as long as that on the wafer to one half in comparison with the template prepared in accordance with the previous embodiments, there is prepared a template containing the information in such shortened length. In such construction, the memories 300 and 301 shift the cells one by one, and the degree of coincidence with the template is determined by the comparator 303. Thus, by finding the degree of coincidence through thinning-out of the information using the squeezed template, the desired high speed processing can be realized without lowering its resolution.

In the following, explanations will be given as to a case where the present invention is put into practice by use of an image pick-up device such as an ITV, in reference to FIGS. 15A to 15C. The explanations below will be made, as one example, on a relative positioning between a mask and a wafer, each having thereon a special positioning mark. FIG. 15A shows a condition, wherein marks 40a, 40b on the side of the mask and a mark 41 on the side of the wafer are imaged by the ITV, the positioning being done by holding the mark 41 between the marks 40a and 40b.

Scanning line 42 of the ITV scans in a manner to cross the edges of each of the marks 40a, 40b and 41, and an image at that time is input into the amplifier 2 as already referred to in the previous embodiments. The scanning by the scanning line 42 is synchronized with the clock signal for reading the data.

First of all, the mask and the wafer are relatively moved to bring the marks 40a, 40b and the mark 41 to their predetermined positions. This positioning operation may be done through naked eyes by reproducing the image signal 43 from the ITV, as shown in FIG. 15B, or may be done automatically by use of a device which takes a space matching between the mark 40a and the mark 41 as well as between the mark 41 and the mark 40b. As soon as the marks 40a, 40b and 41 are brought to their relative positional relationship in this manner, a part of the image signal 43 is stored as the template. This template is prepared in such a manner that, as shown in FIG. 15C, the edge portions $E_1$, $E_2$ of each mark may be included therein from the mark 40a to the mark 40b. Incidentally, a position corresponding to the center part of the mark 41 on the template is referred to as $P_0$.

Then another wafer is positioned with the mask. In this case, the mark 41 may be at a position between the mark 40a and the mark 40b. The image signal 43 is once stored in the memory, as is the case with the previous embodiments. Then, the positions corresponding to the positions $E_1$ and $E_2$ in the template are matched on the basis of the data group stored in the memory. In this case, when a positional difference between the position $P_0$ in the template and the position of the data corresponding to the center part of the mark 41 in the data group is found, the differences between the marks 40a, 40b and the mark 41, i.e., the relative positional difference between the mask and the wafer can be detected.

It should be understood that, in the above-described embodiments of the present invention, the spot light has an elongated shape in its cross-section, and a length substantially corresponding to one chip of the wafer or mask, i.e., a length corresponding to one cycle of the pattern formed periodically on it. It should, however, be noted, on the other hand, that, if the scanning position of the spot light is almost limited to a particular chip, the spot light may have a shorter length than that as mentioned above.

Further, the present invention can also be practiced by shaping the spot light in a very fine circle in its cross-section. In this instance, the circular spot light scans on a particular portion of the wafer and the mask, and the photo-electric information from it is used as the template. And, at the time of the positioning, the photo-electric information to be obtained from the regions containing the particular portions on the wafer and mask is memorized, after which the degree of coincidence with the template may be found out, as is the case with the afore-described embodiments.

It should be noted that the operational functions to find out the degree of coincidence in each of the above-described embodiments can also be processed by software of computers.

Although, in the foregoing embodiments of the positioning device according to the present invention, the patterns formed on the object for detection such as wafer and mask are detected in the form of photo-electric information, the present invention is not limited to this mode of embodiment alone, but it may suffice that any characteristic in the pattern such as its shape, its surface irregularity, and so forth is detected. For this purpose of obtaining the pattern information, there may be used various energy rays such as ultra-sonic waves, X-rays, and so forth, besides use of light.

We claim:

1. A method for positioning an object, on which predetermined patterns are formed and which is mounted on a stage, comprising the steps of:
   (a) converting said patterns into electrical signals corresponding to their positions on said object;
   (b) extracting from the electrical signals first information composed of electrical signals as distributed in correspondence to the patterns contained in a first region on said object which is mounted on said stage in advance;
   (c) extracting from the electrical signals second information composed of electrical signals distributed in correspondence to the patterns contained in a second region inclusive of said first region on said object which is newly mounted on said stage;
   (d) comparing said first and second information, and searching for an electrical signal in said second information having a distribution characteristic that is most similar to that of an electrical signal in said first information; and
   (e) detecting a position of the newly mounted object as a result of said comparing and searching.

2. The method as set forth in claim 1, wherein the step of extracting said first information includes the step of holding electrical signals in first memory having a capacity corresponding to said first region, and the step of extracting said second information includes the step of holding electrical signals in second memory having a capacity corresponding to said second region.

3. The method as set forth in claim 2, wherein said comparing and searching step is further defined as sequentially taking out an electrical signal from said second memory in a predetermined quantity the same as the capacity of said first memory and holding the electrical signal as taken out in third memory, and sequentially comparing the electrical signal held in said third memory with the electrical signal held in said first memory.

4. The method as set forth in claim 3, wherein each of said first memory and said third memory has a predetermined number of memory cells, and said sequentially comparing step is further defined as comparing said electrical signals of said first memory with said electrical signals of said third memory, at every corresponding cell.

5. The method as set forth in claim 4, wherein said sequentially comparing step is further defined as calculating a total sum of the absolute value of a difference between the electrical signal from each memory cell in said first memory and the electrical signal from each memory cell in said third memory.

6. The method as set forth in claim 2, wherein said comparing and searching step is further defined as sequentially taking out an electrical signal from said second memory in a quantity twice as large as the capacity of the first memory and sequentially comparing alternate portions of the taken out signal with the electrical signal held in said first memory.

7. A method as set forth in claim 1, wherein said converting step is further defined as scanning said patterns on said object by a light beam and receiving scattered light from the scanned patterns.

8. A method for positioning an object, on which predetermined patterns composed of a plurality of rectangular units sectioned by boundary lines are formed, comprising the steps of:
   (a) providing an elongated light spot having a length sufficient to scan a corresponding dimension of said rectangular units, scanning said patterns on said object by said light beam spot, with the length of the spot substantially parallel with said boundary lines and with a scanning direction substantially orthogonal to said length, and producing electrical signals corresponding to scattered light intensity from the scanned patterns;
   (b) retaining first information composed of said electrical signals obtained by said scanning of a first region on said object which is mounted on said stage in advance;
   (c) retaining second information composed of said electrical signals obtained by said scanning of a second region inclusive of said first region on said object which is newly mounted on said stage;
   (d) comparing said first and second information, and searching for an electrical signal in said second information having a distribution characteristic that is most similar to that of an electrical signal in said first information; and
   (e) detecting a position of the newly mounted object as a result of said comparing and searching.

9. The method as set forth in claim 8, wherein the step of retaining said first information includes holding electrical signals in first memory having a capacity corresponding to said first region, and the step of retaining said second information includes holding electrical signals in second memory having a capacity corresponding to said second region.

10. The method as set forth in claim 9, wherein said comparing and searching step is further defined as sequentially taking out an electrical signal from said second memory in a predetermined quantity the same as the capacity of said first memory and holding the electrical signal as taken out in third memory, and sequentially comparing the electrical signal held in said third memory with the electrical signal held in said first memory.

11. The method as set forth in claim 10, wherein each of said first memory and said third memory has a predetermined number of memory cells, and said sequentially comparing step is defined as comparing said electrical signals of said first memory with said electrical signals of said third memory, at every corresponding cell.

12. The method as set forth in claim 11, wherein said sequentially comparing step is further defined as calculating a total sum of the absolute value of a difference between the electrical signal from each memory cell in said first memory and the electrical signal from each memory cell in said third memory.

13. The method as set forth in claim 9, wherein said comparing and searching step is further defined as sequentially taking out an electrical signal from said second memory in a quantity twice as large as the capacity of the first memory and sequentially comparing alternate portions of the taken out signal with the electrical signal held in said first memory.

14. The method as set forth in claim 8, wherein said scanning step is further defined as oscillating said light beam on said object at a predetermined cycle, and producing said electrical signals corresponding to positions to be irradiated by said light beam during movement of said oscillated light beam at a substantially constant speed.

15. The method as set forth in claim 8, wherein said scanning step is further defined as oscillating said light beam on said object at a predetermined cycle, and producing said electrical signals when said light beam is at the center of oscillation.

16. A method for positioning an object, on which predetermined patterns composed of a plurality of rectangular units sectioned by boundary lines are formed, comprising the steps of:
- (a) providing an elongated light beam spot having a length substantially equal to the length of one side of said rectangular units, scanning said patterns on said object by said light beam spot, with the length of the spot substantially parallel with said boundary lines and with a scanning direction substantially orthogonal to said length, and producing electrical signals corresponding to scattered light intensity from the scanned patterns;
- (b) extracting from the electrical signals first information composed of electrical signals obtained by said scanning of a first region on said object which is mounted on said stage in advance;
- (c) extracting from the electrical signals second information composed of electrical signals obtained by said scanning of a second region inclusive of said first region on said object which is newly mounted on said stage;
- (d) comparing said first and second information, and searching for an electrical signal in said second information having a distribution characteristic that is most similar to that of an electrical signal in said first information; and
- (e) detecting a position of the newly mounted object as a result of said comparing and searching.

* * * * *